(12) United States Patent
Jiang et al.

(10) Patent No.: US 6,620,560 B2
(45) Date of Patent: Sep. 16, 2003

(54) PLASMA TREATMENT OF LOW-K DIELECTRIC FILMS TO IMPROVE PATTERNING

(75) Inventors: Ping Jiang, Plano, TX (US); Guoqiang Xing, Plano, TX (US); Andrew J. McKerrow, Dallas, TX (US); Robert Kraft, Plano, TX (US); Hyesook Hong, Richardson, TX (US)

(73) Assignee: Texax Instruments Incorporated, Dallas, TX (US)

( * ) Notice: Subject to any disclaimer, the term of this patent is extended or adjusted under 35 U.S.C. 154(b) by 0 days.

(21) Appl. No.: 09/975,109

(22) Filed: Oct. 11, 2001

(65) Prior Publication Data

US 2002/0090822 A1 Jul. 11, 2002

Related U.S. Application Data

(60) Provisional application No. 60/247,562, filed on Nov. 9, 2000.

(51) Int. Cl.$^7$ ................................. H01L 21/302
(52) U.S. Cl. .............. 430/5; 134/1.2; 438/725; 438/734; 438/717; 438/723; 216/67
(58) Field of Search ............... 430/5; 134/1.2; 216/67; 438/725, 734, 717, 723

(56) References Cited

U.S. PATENT DOCUMENTS

| | | | | |
|---|---|---|---|---|
| 5,714,037 A | * | 2/1998 | Puntambekar et al. | 156/643.1 |
| 6,042,999 A | | 3/2000 | Lin et al. | 430/316 |
| 6,165,898 A | * | 12/2000 | Jang et al. | 438/638 |
| 6,187,666 B1 | * | 2/2001 | Singh et al. | 438/633 |
| 6,319,809 B1 | * | 11/2001 | Chang et al. | 438/597 |
| 6,352,921 B1 | * | 3/2002 | Han et al. | 438/638 |
| 6,358,676 B1 | * | 3/2002 | Wu | 430/329 |
| 6,372,653 B1 | * | 4/2002 | Lou et al. | 438/706 |
| 2002/0064951 A1 | * | 5/2002 | Eissa et al. | 438/687 |
| 2002/0081855 A1 | * | 6/2002 | Jiang et al. | 438/694 |

* cited by examiner

*Primary Examiner*—George Goudreau
(74) *Attorney, Agent, or Firm*—Jacqueline J. Garner; W. James Brady, III; Frederick J. Telecky, Jr.

(57) ABSTRACT

Plasma treating a low-k dielectric layer (104) using an oxidation reaction (e.g., $O_2$) to improve patterning. Resist poisoning occurs due to an interaction between low-k films (104), such as OSG, and DUV resist (130, 132). The plasma treatment is performed to either pretreat a low-k dielectric (104) before forming the pattern (130, 132), during a rework of the pattern (130, 132), or between via and trench patterning to reduce resist poisoning.

22 Claims, 1 Drawing Sheet

PLASMA TREATMENT OF LOW-K DIELECTRIC FILMS TO IMPROVE PATTERNING

This application claims priority under 35 USC §119(e)(1) of provisional application No. 60/247,562 filed Nov. 9, 2000.

FIELD OF THE INVENTION

The invention is generally related to the field of forming interconnect layers in a semiconductor device and more specifically to patterning low-k dielectric films.

BACKGROUND OF THE INVENTION

As the density of semiconductor devices increases and the size of circuit elements becomes smaller to achieve better performance, the resistance capacitance (RC) delay time in back-end-of-line (BEOL) increases and dominates the circuit performance. To reduce the RC delay time at BEOL, the demands on interconnect layers for connecting the semiconductor devices to each other also increase. Therefore, there is a desire to switch from the traditional aluminum metal interconnects to copper interconnects and from traditional silicon-dioxide-based dielectrics to low-k dielectrics, such as organo-silicate glass (OSG). Semiconductor fabrication processes for working with the copper interconnects and newer low-k dielectrics are still needed.

As compared to the traditional subtractive plasma dry etching of aluminum, suitable copper etches for a semiconductor fabrication environment are not readily available. To overcome the copper etch problem, damascene processes have been developed. In a damascene process, the IMD (intra-metal dielectric) is formed first. The IMD is then patterned and etched to form trenches for the interconnect lines. If connection vias have not already been formed, a dual damascene process may be used. In a via-first dual damascene process, an ILD (interlevel dielectric) is deposited first, followed by an IMD deposition. An IMD etch-stop layer, such as SiN, can be optionally used in between IMD and ILD. A via is patterned and etched through the IMD and ILD for connection to lower interconnect levels. Then a trench is patterned and etched in the IMD. A barrier layer and a copper seed layer are then deposited over the structure. The barrier layer is typically tantalum nitride or some other binary transition metal nitride. The copper layer is electro-chemically deposited (ECD) using the seed layer over the entire structure. The copper is then chemically-mechanically polished (CMP'd) to remove the copper from over the IMD, leaving copper interconnect lines and vias. A metal etch is thereby avoided.

When low-k dielectrics such as OSG are used for the IMD and ILD, a problem known as resist poisoning occurs. Resist poisoning occurs during a patterning step such as via pattern or trench pattern. It is a result of the interaction between a DUV (deep ultra-violet) resist and low-k films. Resist poisoning causes poor resist sidewall profiles, resist scumming, large CD variations, and requires a large resist exposure dose. Furthermore, the required resist exposure dose to achieve the target CD becomes too high and varies with film aging. A process to reduce or eliminate resist poisoning in low-k dielectrics is therefore desired.

SUMMARY OF THE INVENTION

The invention is a plasma treatment for low-k films that improves patterning. The low-k film is treated with a plasma using oxidation-type reactions to eliminate or significantly reduce resist poisoning. The plasma treatment can be performed at various stages in the semiconductor fabrication process with or without the presence of resist. For example, this treatment can be applied to as-deposited low k films before patterning (pre-treatment), or as a post-etch clean step, or to stripping photoresist for lithograph rework.

An advantage of the invention is providing a treatment to reduce or eliminate resist poisoning of low-k dielectric films.

This and other advantages will be apparent to those of ordinary skill in the art having reference to the specification in conjunction with the drawings.

DETAILED DESCRIPTION OF THE EMBODIMENTS

The invention will now be described in conjunction with dual damascene copper interconnect process. It will be apparent to those of ordinary skill in the art that the benefits of the invention may be applied generally to patterning of low-k (K<3.0) and ultra-low-k (K<2.5) films.

Figure 1A:
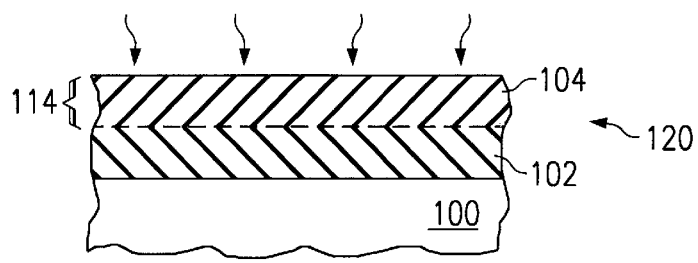
FIGS. 1A–1F are cross-sectional diagrams of a process for forming metal interconnects according to the embodiments of the invention.

In order to form the copper interconnects using a dual damascene process, the interlevel dielectric (ILD 102) and intra-metal dielectric (IMD 104) of FIG. 1A are patterned and etched to form trenches in IMD 104 and vias in ILD 102. When low-k or ultra low-k materials are used for the ILD and IMD, an interaction between the resist and the low-k materials causes resist poisoning. The cause of resist poisoning is believed to be the interaction between the DUV resist and nitrogen-containing reagents from the low-k films. Possible sources of nitrogen include: the low-k film, the dielectric cap and optional IMD etch-stop layers (e.g., SiN) and/or chemistries used in the deposition of these films, $N_2$ in the clean (ash) process, $N_2$ in the etch chemistry, and the photoresist itself.

In order to reduce or eliminate the resist poisoning, a plasma treatment using oxidation reactions is performed. In the preferred embodiment, an $O_2$ plasma is used. Alternatively, other oxidation gases such as $O_3$, $CO_2$, $CO$, $SO_2$, $H_2O$, and $H_2O_2$ may be used with or without gas additives like Ar or He.

As an example, the following $O_2$ plasma process may be used:

| | |
|---|---|
| Time: | ~1 min. |
| Pressure: | ~150 mT |
| Power: | ~400 W |
| Flow: | ~400 sccm $O_2$ |
| Chuck Temp.: | ~40° C. |

The plasma process conditions are designed to remove nitrogen in the film that may have been introduced during its deposition or during subsequent processing and therefore prevent resist poisoning. The duration of the plasma treatment is highly dependent on the amount of nitrogen from the various nitrogen sources to be removed. For example, if a SiN capping layer is used, the duration of the plasma process would need to increase to around 3 minutes due to the additional nitrogen source from the SiN deposition process. In the case of re-work, the process time for via rework is around 2 mins while it is around 3 mins for trench re-work (due to barc fill inside vias).

The above plasma treatment using oxidation reactions is beneficial at a variety of places in a metal interconnect process. The embodiments described below provide examples of where the plasma treatment may be performed to reduce or eliminate resist poisoning. These embodiments may be combined to further reduce or eliminate resist poisoning.

Embodiments of the invention will now be discussed with reference to FIGS. 1A–1F. A semiconductor body 100 is processed through formation of the ILD 102/IMD 104. Semiconductor body 100 typically comprises a silicon substrate having transistors and other elements formed therein. IMD 104 is the dielectric for a copper interconnect level. Copper interconnect level may be the first or any subsequent metal interconnect level of the semiconductor device 120.

An ILD 102 is formed over semiconductor body 100. IMD 104 is formed over ILD 102. A trench etchstop layer (not shown) may optionally be placed between ILD 102 and IMD 104. ILD 102 and IMD 104 comprise low-k or ultra low-k dielectrics, such as organo-silicate glass (OSG), inorganic films and organic films. In the preferred embodiment, ILD 102 and IMD 104 comprise the same material. However, ILD 102 and IMD 104 may alternatively comprise different materials. A capping layer (not shown) may be formed over IMD 104 if desired. Typically, the capping layer comprises silicon nitride. Alternatively, a silicon oxide, silicon oxynitride (SiON), Si-rich nitride (SRN), or SiC capping layer or no capping layer may be used.

Figure 1B:
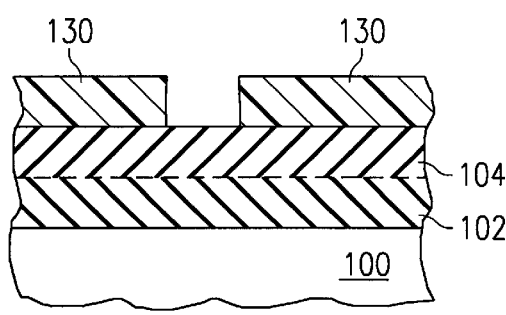

In a first embodiment of the invention the plasma treatment (using oxidation reactions as described above) is performed prior to forming the via pattern 130. Then, the via pattern 130 is formed as shown in FIG. 1B. The plasma pre-treatment reduces resist poisoning at the via pattern level.

It is sometimes necessary to rework a resist pattern. Rework is a process of removing the photoresist and/or BARC material for re-patterning. Pattern rework significantly worsens the resist poisoning problem if a non-optimized ash process is used for re-work. Accordingly, in a second embodiment of the invention, the plasma treatment (using oxidation reactions) is used to rework via pattern 130. Alternatively, the plasma treatment may be used in addition to a conventional wet or dry resist rework process. Using the plasma treatment according to the invention either as a pattern re-work or as the last step of a re work process reduces or eliminates resist poisoning associated with the via pattern.

Figure 1C:
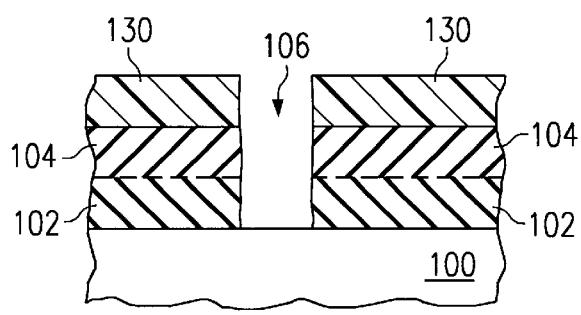

After any desired pattern re-work, the via 106 is then etched through IMD 104 and ILD 102, as shown in FIG. 1C. According to a third embodiment of the invention, a plasma treatment (using oxidation reactions) may be used as a post etch clean to remove via pattern 130 as well as reduce or eliminate resist poisoning in a subsequent trench pattern step. If desired, the plasma treatment may instead be performed in addition to a traditional post etch clean process.

In order to protect the bottom of via 106 during the subsequent trench etch, via 106 may be partially or completely filled. For example, an organic barc (bottom antireflection coating) may be deposited over the structure and etched back such that BARC material remains only in the via 106.

In a fourth embodiment of the invention, the exposed surfaces of IMD 104 (and via sidewall) may be pre-treated with the plasma using oxidation reactions. Pre-treatment prior to forming the trench pattern eliminates or reduces resist poisoning at the trench pattern level.

Figure 1D:
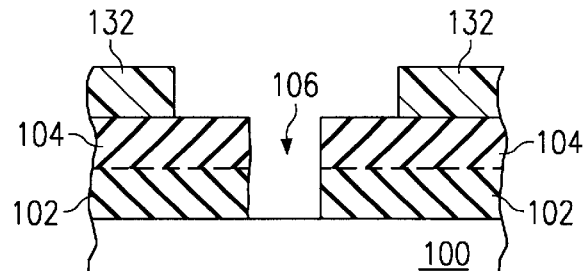

After a post via etch clean and plasma pre-treatment if desired, a trench pattern 132 may be formed over IMD 104, as shown in FIG. 1D. If rework of the trench pattern 132 is desired, the plasma treatment may be used to rework the trench pattern 132 or combined with a traditional wet or dry pattern rework process to reduce resist poisoning at the trench pattern level according to a fifth embodiment of the invention.

Figure 1E:
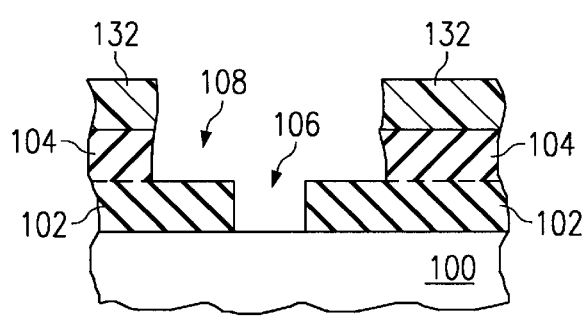

After any desired pattern rework, a trench 108 is etched in IMD 104, as shown in FIG. 1E. Trench pattern 132 is then removed. Copper interconnect structures will subsequently be formed in trench 108 and via 106.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. A seed copper layer is then deposited over barrier layer 110.

Electrochemical deposition (ECD) may then be used to deposit copper layer 124. Various copper ECD processes are known in the art. In one example, a 3-step process is used. After placing the wafer in the plating solution, a current of approximately 0.75 Amps is passed through the seed layer for a time on the order of 15 seconds. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 1F:
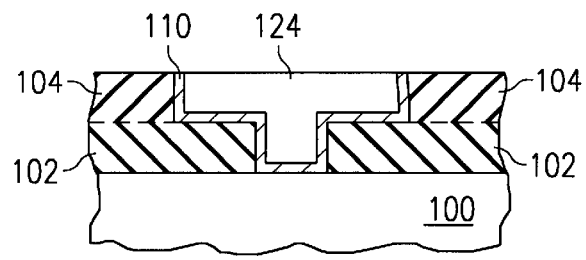

After copper ECD, the copper 124 and barrier 110 are chemically mechanically polished (CMP) to remove the material from above IMD 104. The resulting structure is shown in FIG. 1F. Next level ILD and IMD may be deposited and processing may then continue to form additional metal interconnect levels and package the device.

As a result of the plasma treatment according to the invention, the DUV pattern energy required to achieve the target CD (critical dimension) is reduced. In one experiment, a 0.22 $\mu$m via was patterned using 1200 Å BARC and 4500 Å resist. The $O_2$ plasma process conditions were: pressure-45 mT, power-400 W, $O_2$ flow rate-400 sccm, and a chuck temperature of 40° C. The pattern energies required to achieve the target CD were as shown below:

| | |
|---|---|
| OSG films without $O_2$ ash: | 37–60 mJ/cm$^2$ |
| OSG films with $O_2$ pretreatment: | 26–30 mJ/cm$^2$ |
| OSG films with $O_2$ ash rework: | 26–30 mJ/cm$^2$ |

The dose variations in the without $O_2$ ash case above are mainly due to differences (e.g., aging) in incoming films.

Employing an $O_2$ plasma treatment prior to a photolithography process improves (by lowering) the expose energy for printing the target CD as well as the degree of resist poisoning area where the vias are open. For the trench process, before trench pattern, wafers were treated with $O_2$ plasma at a pressure of 45 mT, a power of 400 W, an $O_2$ flow rate of 400 sccm, and a chuck temperature of 40 C. Then, 850 Å of BARC and 4200 Å of photoresist were applied to print a pattern. The required expose energy dose to print the target CD are below Pattern on OSG without using $O_2$ plasma treatment: 30–36 mJ/cm2

Pattern on OSG with $O_2$ plasma pretreatment: 27–28 mJ/cm2

Pattern on OSG with $O_2$ plasma rework: 27–28 mJ/cm2

The exposure dose fluctuation in case of without $O_2$ treatment was due to variations in time between the via etch clean process and the photolithography process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:

forming a low-k dielectric layer over a semiconductor body;

treating said low-k dielectric layer with a plasma using an oxidation reaction prior to forming any resist pattern on said low-k dielectric;

forming a resist pattern over said low-k dielectric layer; and etching said low-k dielectric layer using said resist pattern.

2. The method of claim 1, wherein said plasma comprises $O_2$.

3. The method of claim 1, wherein said plasma comprises a gas selected from the group consisting of $H_2O$, $O_3$, $SO_2$, $CO_2$, CO, and $H_2O_2$.

4. The method of claim 1, wherein said low-k dielectric layer comprises organo-silicate glass.

5. The method of claim 1, wherein said low-k dielectric layer comprises an ultra-low-k dielectric layer having a dielectric constant less than 2.5.

6. The method of claim 1, further comprising a pattern re-work step in addition to said treating step.

7. A method of fabricating an integrated circuit having copper metal interconnects, comprising the steps of:

forming an interlevel dielectric (ILD) over a semiconductor body;

forming an intrametal dielectric (IMD) over the ILD;

plasma treating said IMD using an oxidation reaction;

forming a via resist pattern over said IMD;

etching a via in said IMD and ILD using said via resist pattern;

removing said via resist pattern;

at least partially filling said via with a material;

forming a trench resist pattern over said IMD;

etching a trench in said IMD using said trench resist pattern;

removing said trench resist pattern and said material in said via; and forming a copper interconnect in said via and said trench.

8. The method of claim 7, wherein said plasma treating step comprises $O_2$.

9. The method of claim 7, wherein said plasma treating step comprises a gas selected from the group consisting of $H_2O$, $O_3$, $SO_2$, $CO_2$, CO, and $H_2O_2$.

10. The method of claim 7, wherein said plasma treating step occurs prior to the step of forming the via resist pattern.

11. The method of claim 10, further comprising the step of additionally plasma treating the IMD using an oxidation reaction after said step of etching the via and prior to the step of patterning the trench.

12. The method of claim 7, wherein said plasma treating step occurs after the step of forming the via resist pattern as part of a pattern re-work step.

13. The method of claim 7, wherein said plasma treating step occurs after said step of etching the via and prior to the step of patterning the trench.

14. The method of claim 12, wherein said plasma treating step removes said via resist pattern.

15. The method of claim 12, further comprising a post via etch clean step, wherein said plasma treating step occurs after said post via etch clean step.

16. The method of claim 7, wherein said plasma treating step occurs prior to the step of forming the trench resist pattern.

17. The method of claim 7, wherein said plasma treating step occurs after the step of forming the trench resist pattern as part of a pattern re-work step.

18. The method of claim 7, wherein said plasma treating step occurs after said step of etching the trench to remove trench resist pattern.

19. A method for fabricating an integrated circuit, comprising the steps of:

forming a low-k dielectric layer over a semiconductor body;

forming a first resist pattern over said low-k dielectric layer; and removing said first resist pattern;

after completely removing said first resist pattern, treating said low-k dielectric layer with a plasma using an oxidation reaction prior to forming a second resist pattern;

forming a second resist pattern over said tow-k dielectric layer; and removing said second resist pattern.

20. The method of claim 19, further comprising the steps of:

etching said low-c dielectric layer with said first resist pattern.

21. The method of claim 20, further comprising the steps of:

etching said low-dielectric layer with said second resist pattern.

22. The method of claim 20, further comprising the steps of:

etching said low-k dielectric layer with said second resist pattern.

* * * * *